(12) United States Patent
Cheng et al.

(10) Patent No.: US 6,974,991 B2
(45) Date of Patent: Dec. 13, 2005

(54) DRAM CELL WITH BURIED COLLAR AND SELF-ALIGNED BURIED STRAP

(75) Inventors: Kangguo Cheng, Beacon, NY (US); Ramachandra Divkaruni, Ossining, NY (US); Gary Bela Bronner, Stormville, NY (US); Carl John Radens, LaGrangeville, NY (US); Oleg G. Gluschenkov, Poughkeepsie, NY (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 10/696,151

(22) Filed: Oct. 29, 2003

(65) Prior Publication Data

US 2005/0093044 A1 May 5, 2005

(51) Int. Cl.[7] .............................................. H01L 27/108
(52) U.S. Cl. ....................................... 257/302; 257/301
(58) Field of Search ................................. 257/301, 302, 257/E27.091–E27.093; 438/242

(56) References Cited

U.S. PATENT DOCUMENTS

| | | | |
|---|---|---|---|
| 5,849,638 A | 12/1998 | Ho et al. | |
| 6,184,549 B1 | 2/2001 | Furukawa et al. | |
| 6,190,988 B1 | 2/2001 | Furukawa et al. | |
| 6,403,412 B1 | 6/2002 | Economikos et al. | |
| 6,414,347 B1 | 7/2002 | Divakaruni et al. | |
| 6,448,131 B1 | 9/2002 | Cabral et al. | |
| 6,495,411 B1 | 12/2002 | Mei | |
| 6,544,838 B2 | 4/2003 | Ranade et al. | |
| 6,555,430 B1 | 4/2003 | Chudzik et al. | |
| 6,583,462 B1 | 6/2003 | Furukawa et al. | |
| 6,599,798 B2 * | 7/2003 | Tews et al. | 438/249 |
| 2002/0105019 A1 * | 8/2002 | Mandelman et al. | 257/296 |
| 2002/0106857 A1 | 8/2002 | Jammy et al. | |

* cited by examiner

*Primary Examiner*—Tom Thomas
*Assistant Examiner*—Matthew C Landau
(74) *Attorney, Agent, or Firm*—Howard M. Cohn; H. Daniel Schnurmann

(57) ABSTRACT

In a DRAM cell having a trench, a cell capacitor and a cell transistor, a node conducting element connects the cell capacitor to the cell transistor and a collar is disposed about the node conducting element. The collar is disposed in the substrate at least partially, up to entirely outside of the trench. Because the collar is disposed in the substrate outside of the trench, it does not restrict the size of the trench opening. This enables sub-100 nm trenches, using techniques which are compatible with contemporary DRAM process steps. A strap is embedded into a top surface of the collar.

11 Claims, 8 Drawing Sheets

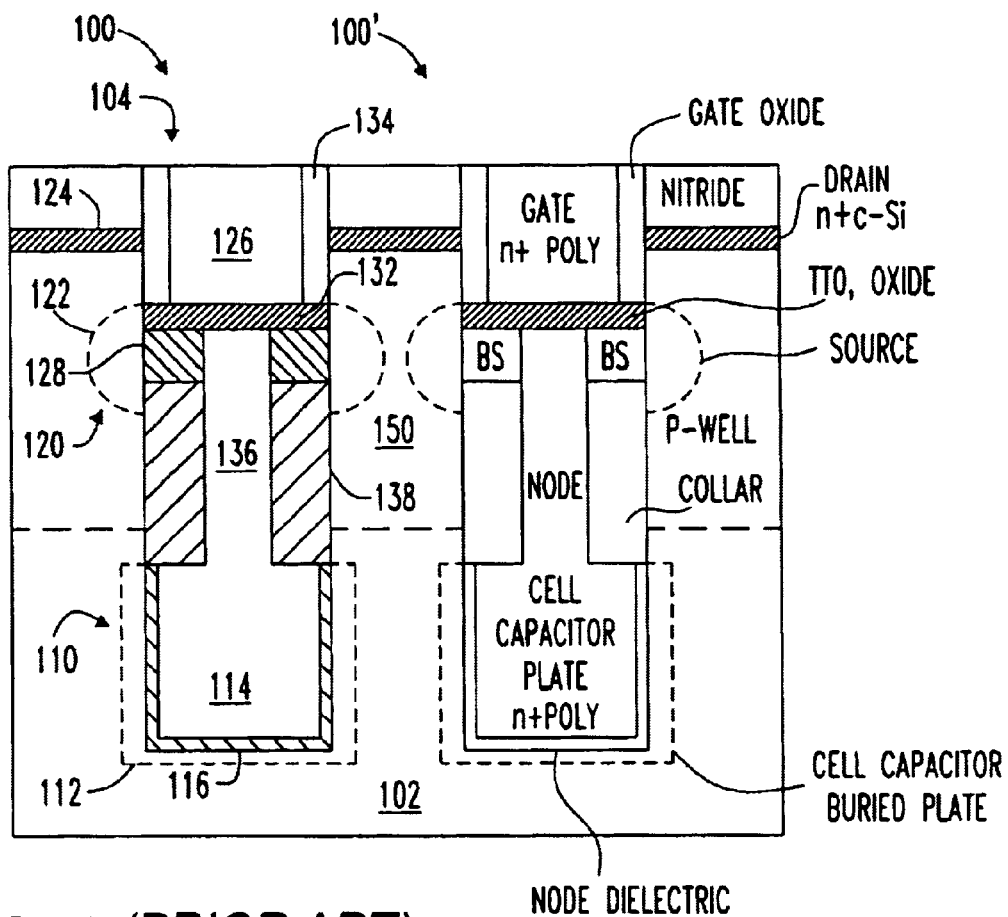
FIG. 1 *(PRIOR ART)*
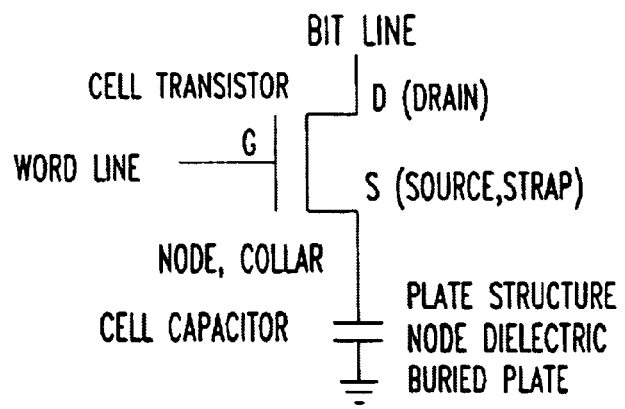
FIG. 1A *(PRIOR ART)*

DRAM CELL WITH BURIED COLLAR AND SELF-ALIGNED BURIED STRAP

TECHNICAL FIELD OF THE INVENTION

The present invention relates to semiconductor devices, particularly to DRAM cells, and more particularly to vertical DRAM cells.

BACKGROUND OF THE INVENTION

As noted in "The evolution of IBM CMOS DRAM technology", E. Adler et al., IBM Journal of Research and Development, Volume 39, Number 12, 1995, the one-device DRAM cell, invented at IBM by R. Dennard, consists of a cell transistor with the drain (or source) connected to one node of the cell storage capacitor, the source (or drain) connected to a bit line, and the gate connected to the word line, which runs orthogonal to the bit line. The requirement to have a large capacitor in a small space with low leakage is the main driver of DRAM technology. A brief description of the cell operation will help to explain why. To write, the bit line is driven to a high or low logic level with the cell transistor turned on, and then the cell transistor is shut off, leaving the capacitor charged high or low. Since charge leaks off the capacitor, a maximum refresh interval is specified. To read, or refresh the data in the cell, the bit line is left floating when the cell transistor is turned on, and the small change in bit-line potential is sensed and amplified to a full logic level. The ratio of cell capacitance to bit-line capacitance, called the transfer ratio, which ranges from about 0.1 to 0.2, determines the magnitude of the change in bit-line potential. A large cell capacitance is needed to deliver an adequate signal to the sense amplifier. As further noted in this article, in a folded bit-line configuration, a cell is crossed by two word lines and one bit line. One of the word lines (WL1) is the "active word line" for the cell, and forms the gate of the cell device. The second word line (WL2), the "passing word line," is the gate of the cell device on the adjacent cell.

FIG. 1 illustrates two (an adjacent pair of) DRAM cells 100, 100' of the prior art, and FIG. 1A illustrates an equivalent circuit for a single DRAM cell 100. The DRAM cells are fabricated in a silicon wafer 102 which may be lightly doped. For each DRAM cell, a deep trench 104 is formed in the wafer, extending from the top surface of the wafer into the wafer. A typical trench for a DRAM cell would have depth (vertical on the page) of approximately 60,000 Angstroms (6000 nm, 6 $\mu$m), a width (across the page) of approximately greater than 1000 Angstroms (>100 nm, >0.1 $\mu$m), and a length (into the page) of approximately greater than 2000 Angstroms (>200 nm, >0.24 $\mu$m), two side walls (shown) and two end walls (not shown). Two trenches are shown in FIG. 1. The elements in the trench on the left are numbered (###), and the elements in the trench on the right are labeled (text). In a DRAM device, there would be a great multitude of such trenches and DRAM cells. Each DRAM cell 100 comprises a cell capacitor 110 and a transfer device 120. Word lines and bit lines are omitted from the view of FIG. 1, for illustrative clarity. In the main hereinafter, the construction of a single DRAM cell is described.

The cell capacitor 110 is formed at a bottom portion of the trench and comprises a first plate 112, a second plate 114, and a dielectric (node dielectric) 116 separating the two plates. The first plate 112 is simply a heavily doped region in the wafer adjacent a bottom portion of the trench. The second plate 114 (sometimes referred to as "node plate") is a conductive structure which is formed in the bottom of the trench; in this example, n+ (arsenic doped) polysilicon. The node dielectric 116 is suitably nitride or oxynitride formed in the bottom portion of the trench. The height of the cell capacitor 110 is typically approximately 3–6 $\mu$m, and it typically has a capacitance of approximately 20–40 fF.

The transfer device 120 which is a field effect transistor (FET) is formed at a top (upper) portion of the trench (above the cell capacitor 110) and comprises a source region 122 disposed adjacent the trench, a drain 124 disposed adjacent the trench and vertically spaced from the source 122, and a gate 126 disposed in a top portion of the trench adjacent to and in proximity with both of the source and drain. The source region 122 is diffusion into the wafer from a buried strap (BS) 128. Trench Top Oxide (TTO) 132 is disposed atop the strap 128, between the strap 128 and the gate 126. It isolates (insulates) the gate 126 from the capacitor 110 in the bottom (lower) portion of the trench. Channel oxide 134 is disposed between the sides of the gate 126 and the trench sidewalls. The substrate above the lower edge of collar is doped to form a p-well 150.

The strap 128 is connected to the plate 114 of the cell capacitor by a storage node conductor (or simply, "node") 136 which is surrounded by a collar 138 of oxide. (The storage node conductor 136 connects the cell capacitor 110 to the cell transistor 120.) The storage node conductor 136 comprises n+ polysilicon, has a length of >1 $\mu$m and has a thickness of >40 nm. The collar 138 comprises oxide, has a length of >1 $\mu$m (same as the node conductor 136) and has a thickness of >30 nm.

In the equivalent circuit of FIG. 1A, the source (S) can be swapped for the drain (D), depending on the chosen polarity of the overall circuit. One of the source or drain is connected to the node plate of the cell capacitor, the other of the source or drain is connected to the bit line (not shown). The gate (G) of the cell transistor is connected to the word line (not shown).

The processes for forming the DRAM cells 100, 100' described hereinabove are contemporary DRAM process steps. The following US Patents are cited as being exemplary of various techniques, processes and materials which may be used to implement the present invention. They are intended to provide a general background relating to various contemporary DRAM process steps, not an exhaustive education on the subject.

U.S. Pat. No 6,184,549, issued Feb. 6, 2001 to Furukawa et al. (IBM), discloses trench storage dynamic random access memory (DRAM) cell with vertical transfer device. As discussed therein, as DRAM cells are scaled to meet chip-size requirements for future generations, the channel length of transfer devices on the surface of the silicon substrate can no longer be scaled without degrading off-state leakage requirements (or retention time requirements). Process steps become complex and incompatible with standard DRAM processes, when vertical transfer devices in the DRAM cell are employed to decouple the channel length from layout ground rules.

U.S. Pat. 6,414,347, issued on Jul. 2, 2002 to Divakaruni et al. (IBM), discloses a vertical MOSFET. As discussed therein, trench capacitors are frequently used with DRAM cells. A trench capacitor is a three-dimensional structure formed into a silicon substrate. This is normally formed by etching trenches of various dimensions into the silicon substrate. Trenches commonly have N+ doped polysilicon as one plate of the capacitor (a storage node). The other plate of the capacitor is formed usually by diffusing N+ dopants out from a dopant source into a portion of the substrate surrounding the lower part of the trench. Between these two plates, a dielectric layer is placed which thereby forms the capacitor.

U.S. Pat. No. 6,583,462, issued Jun. 24, 2003 to Furukawa et al. (IBM), discloses vertical DRAM having metallic node conductor. A dynamic random access memory (DRAM) device is formed in a substrate having a trench. The trench has a side wall, a top, a lower portion, and a circumference. The device includes a signal storage node including a metallic storage node conductor formed in the lower portion of the trench and isolated from the side wall by a node dielectric and a collar oxide above the node dielectric. Preferably, the trench has an aspect ratio of greater than 50. A buried strap is coupled to the storage node conductor and contacts a portion of the side wall of the trench above the collar oxide. A trench-top dielectric which is formed upon the buried strap has a trench-top dielectric thickness. A signal transfer device includes a first diffusion region extending into the substrate adjacent the portion of the trench side wall contacted by the buried strap, a gate insulator having a gate insulator thickness formed on the trench side wall above the first buried strap, wherein the gate insulator thickness is less than the trench-top dielectric thickness, and a gate conductor formed within the trench upon the trench-top dielectric and adjacent the gate insulator. The signal transfer device of the memory device (200) includes a first diffusion region (214), coupled to the storage node conductor (208) by a buried strap (216), and a second diffusion region (218). The channel region (228) is controlled by the gate conductor (220) and a gate dielectric (222). The gate conductor (220) is coupled to the word line (224). The gate conductor (220) is isolated from the channel region (228) by the gate oxide layer (222) which is either grown thermally or deposited. The second diffusion region (218) is coupled to the bit line contact (227) and a bit line (226).

The ongoing development of DRAMs is in the direction making the memory cells smaller and smaller, so that more memory cells can fit in a given small area (e.g., on a chip). For example, cell size was reduced by a factor of 18.8 in the time between the 4 Mb and 256 Mb generations.

The following articles discuss some of the challenges facing development of sub-100 nm generation DRAM cells:—"Challenges and future directions for the scaling of DRAM," J. Mandelman et al., *IBM Journal of Research and Development*, Volume 46, Number 2/3, March/May 2002, page 187–212.—"A highly manufacturable 110 nm DRAM technology with $8F^2$ vertical transistor cell for 1 Gb and beyond," H. Akatsu et al., 2002 *IEEE Symposium on VLSI Technology*, page 52–53—"A highly cost efficient 8F2 DRAM cell with a double gate vertical transistor device for 100 nm and beyond," R. Weis, 2001 *International Electron Device Meeting (IEDM)*, page 415–418

The scaling down of traditional trench DRAM to sub-100 nm generations is limited, among other things, by issues related to the buried strap (BS) and the traditional collar scheme.

With regard to the buried strap, increased leakage current or even shorts ("short circuits") could occur due to the interaction of neighboring buried straps caused by the reduced space in sub-100 nm generations. (See, for example, the buried straps 128 of FIG. 1.) In addition, device performance is degraded due to the undesired buried strap to p-well junction capacitance.

With regard to the traditional collar scheme, a minimum collar thickness of 30 nm is required in order to suppress the parasitic leakage between the buried strap (e.g., 128, FIG. 1) and the buried plate (e.g., 114, FIG. 1). For traditional trench DRAM, the collar is deposited inside the trench (within the opening of the trench). As the trench size shrinks beyond 100 nm, the trench opening becomes less than 40 nm (100 nm-(2×30 nm)) after collar deposition. Filling such narrow trenches with poly becomes extremely difficult, and the consequent poly seams (voids) dramatically increase the resistance, which consequently severely degrades the device performance. Additionally, the minimum collar length of 1 μm (1000 nm) is also required to suppress the parasitic leakage path. For sub-100 nm generations, maintaining the minimum of trench capacitance of 40 fF/cell becomes increasingly challenging as both trench size and trench depth are reduced. Unfortunately, trench capacitance cannot be increased by reducing the collar length in the traditional inside collar scheme due to the minimum length requirement to suppress parasitic leakage.

In view of the foregoing, it would be desirable to provide an improved technique for DRAM cell construction which is suitable for sub-100 nm trenches, using techniques which are compatible with contemporary DRAM process steps.

BRIEF SUMMARY OF THE INVENTION

According to the invention, a DRAM cell comprises a semiconductor substrate; a trench extending into the substrate; a cell capacitor disposed in a bottom portion of the trench; a cell transistor disposed in a top portion of the trench above the cell capacitor; a node conducting element connecting the cell capacitor to the cell transistor; and a collar disposed about the node conducting element between the cell transistor and the cell capacitor; wherein the collar is disposed in the substrate, at least partially outside of the trench, between the cell capacitor and the cell transistor. The collar may be disposed substantially outside of the trench or wholly (entirely) outside of the trench.

According to the invention, a method of forming the DRAM cell comprises forming trenches in a semiconductor substrate; forming cell capacitors in a bottom portion of the trench; forming cell transistors in a top portion of the trench; and for each DRAM cell, providing a collar between the cell capacitor and the cell transistor, the collar being disposed in the substrate, at least partially, outside of the trench.

Because the collar is disposed in the substrate, outside of the trench, it does not restrict the size of the trench opening.

According to a feature of the invention, a strap is embedded into a top surface of the collar. It extends no higher than the collar, and is laterally surrounded by the collar.

Because the strap is embedded in the collar, outward and downward diffusion of the strap into the substrate is constrained.

As compared with conventional DRAM fabrication techniques, the technique of the present invention offers the following advantages:

- it is scalable to sub-100 nm, including sub-90 nm generations,
- suppressed BS-to-BS interaction,
- reduced BS junction capacitance,
- eliminates the node poly fill issue,
- increased trench capacitance due to short buried collar,
- allowing dopant flexibility in p-well to improve device performance,
- compatible to capacitance enhancement approaches such as forming a bottle in the lower trench, or roughening the trench surface.

The BS-to-BS leakage is suppressed since lateral out-diffusion of the buried strap (BS) is suppressed by the collar. Furthermore, the BS to p-well junction capacitance is also reduced. Since the collar is formed by etching into the trench sidewall, the poly fill problem in the traditional collar scheme can be successfully solved. Meanwhile, the collar can be dramatically shortened because the buried strap is isolated from the buried plate primarily by oxide instead of p-well.

The invention is applicable to embedded DRAM, ASIC and other products with trench technology, and any semiconductor products with vertical gate cells.

BRIEF DESCRIPTIONS OF THE DRAWINGS

The structure, operation, and advantages of the present invention will become further apparent upon consideration of the following description taken in conjunction with the accompanying figures (FIGs.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

FIG. 1 is a cross-sectional view of an adjacent pair of DRAM cells of the prior art.

FIG. 1A is a diagram of an equivalent circuit for a DRAM cell of the prior art.

DETAILED DESCRIPTION OF THE INVENTION

In the following description, numerous details are set forth in order to provide a thorough understanding of the present invention. It will be appreciated by those skilled in the art that variations of these specific details are possible while still achieving the results of the present invention. Well-known processing steps are generally not described in detail in order to avoid unnecessarily obfuscating the description of the present invention.

Figure 2:
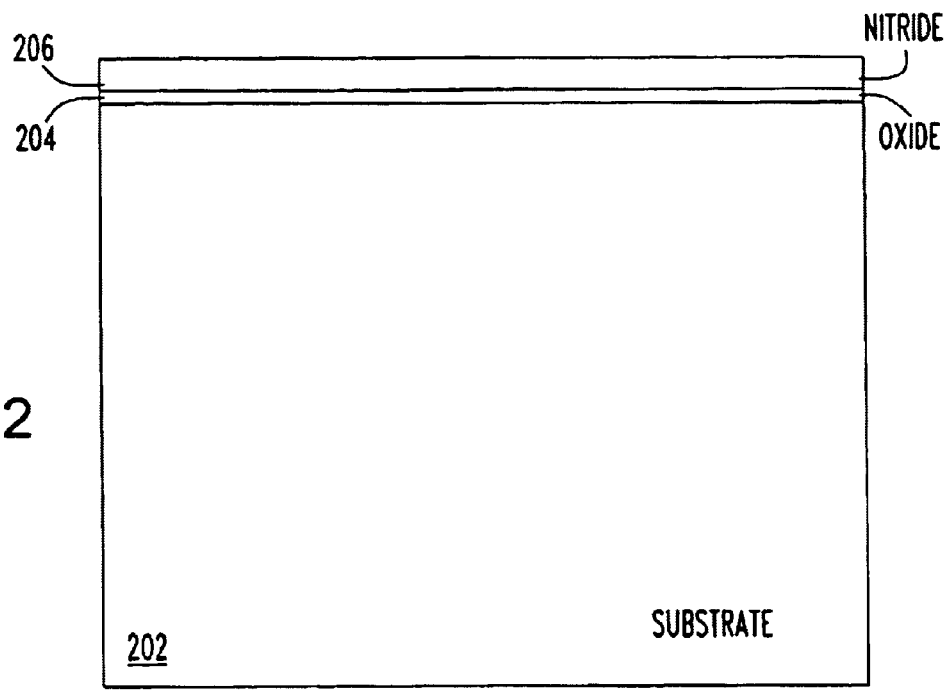
FIGS. 2 and 2A–2L are cross-sectional views illustrative of a sequence of steps for forming an adjacent pair of DRAM cells, according to the invention.
Figure 2A:
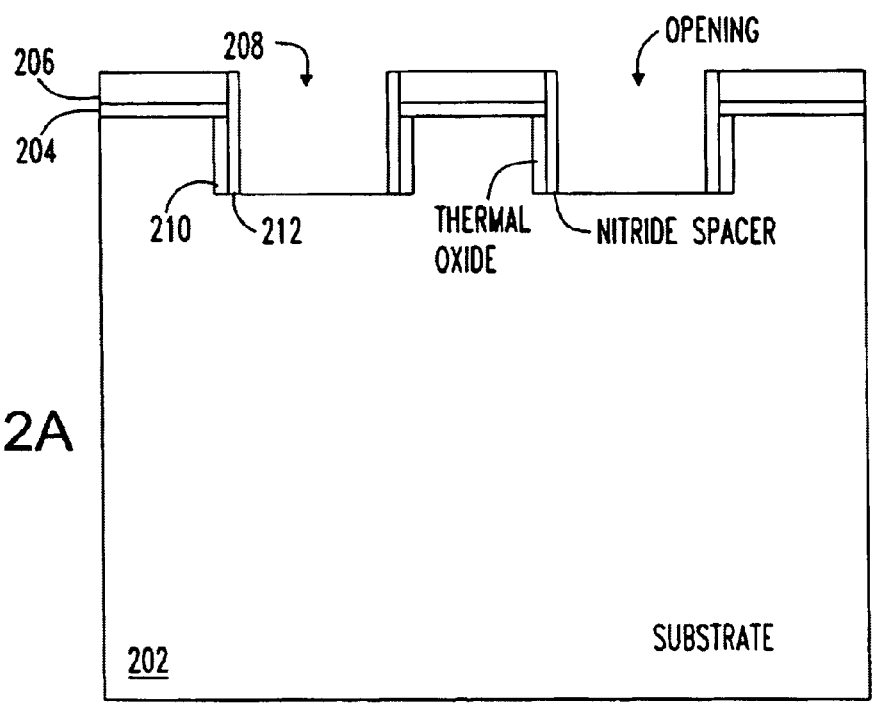
Figure 2B:
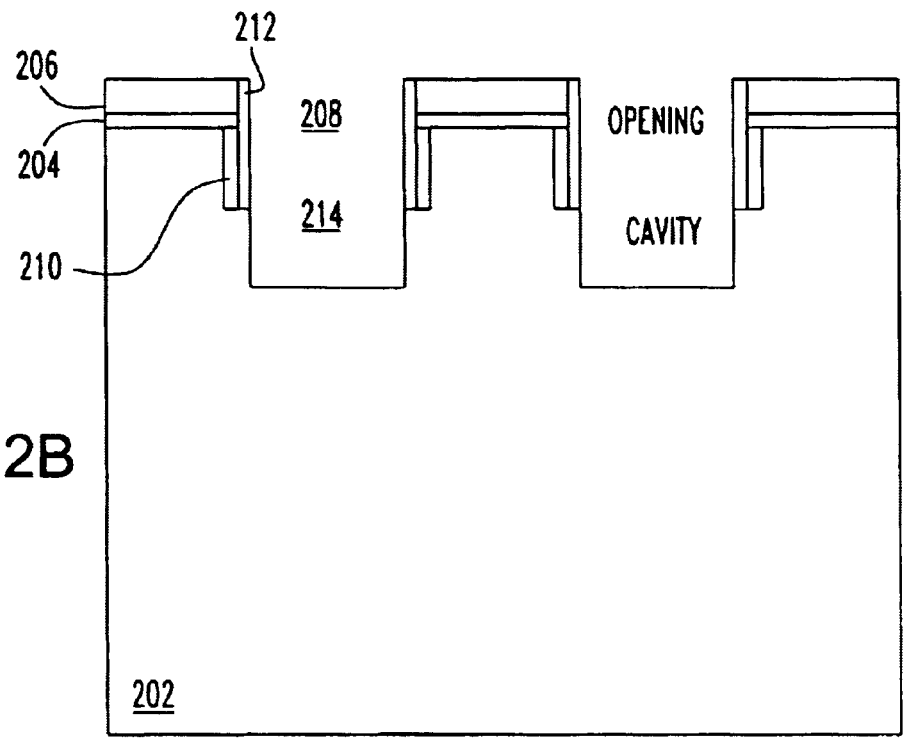
Figure 2C:
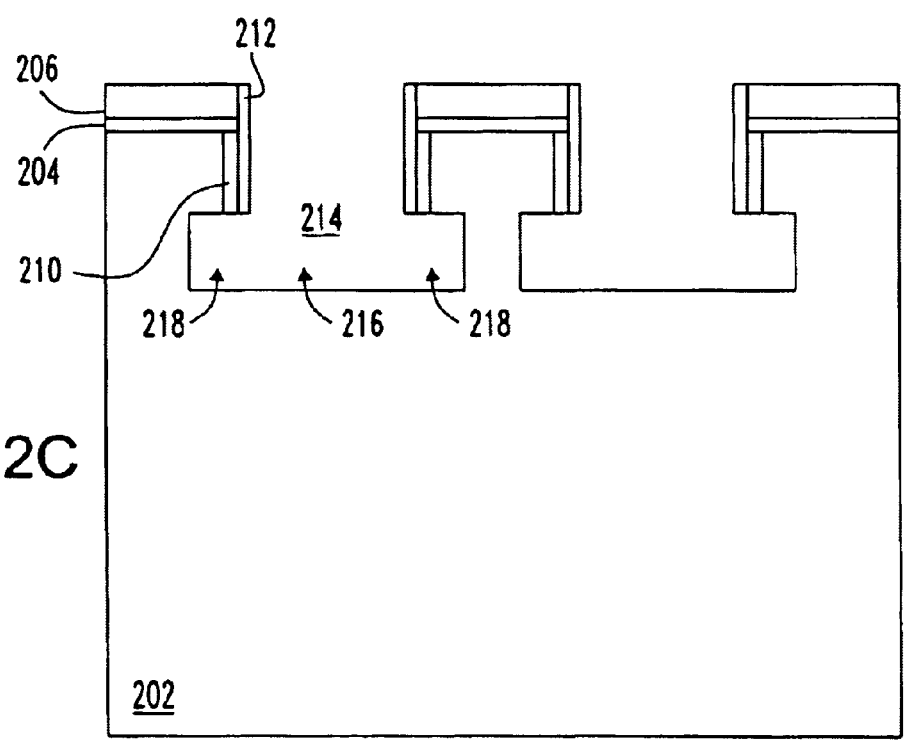
Figure 2D:
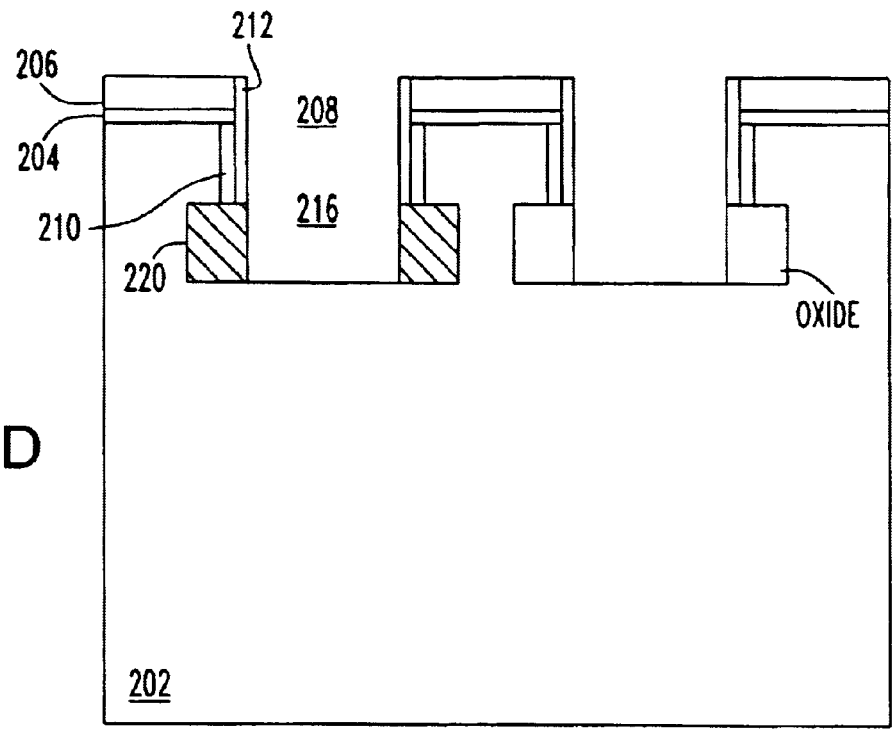
Figure 2E:
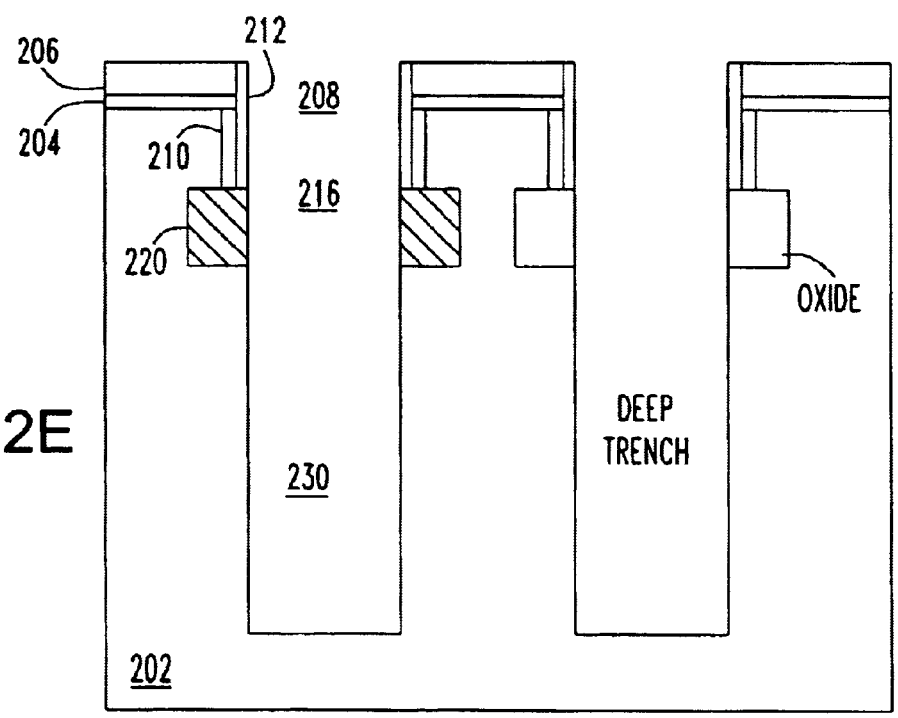
Figure 2F:
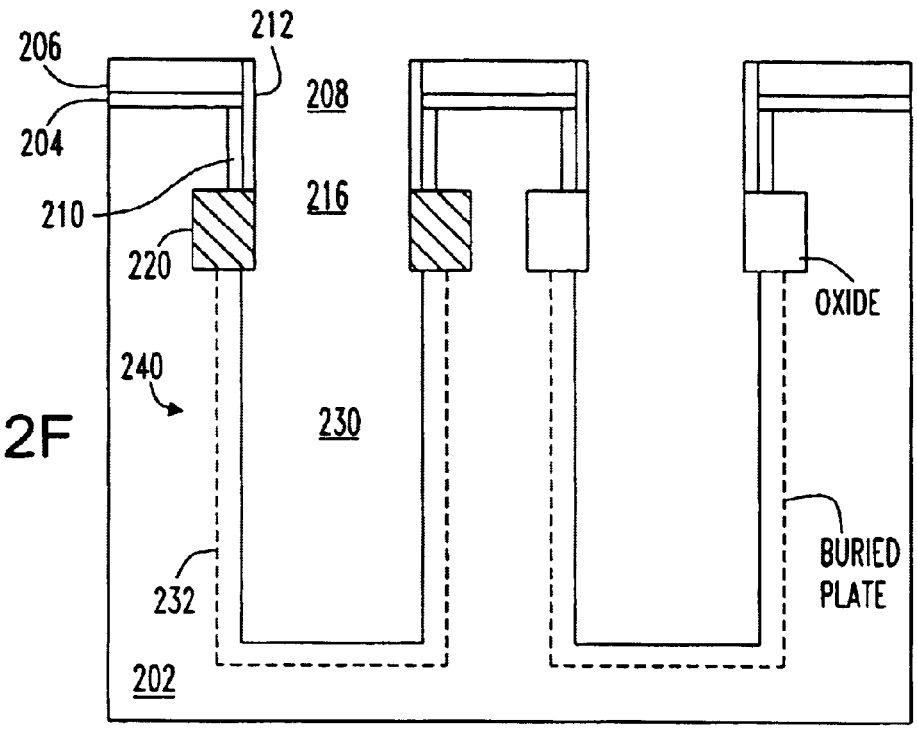
Figure 2G:
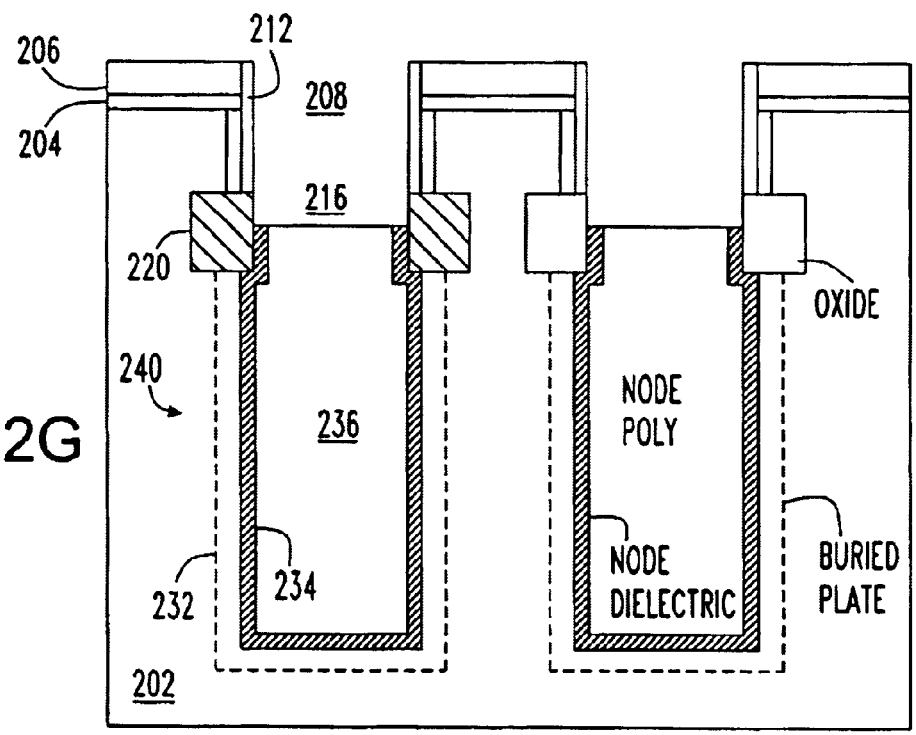
Figure 2H:
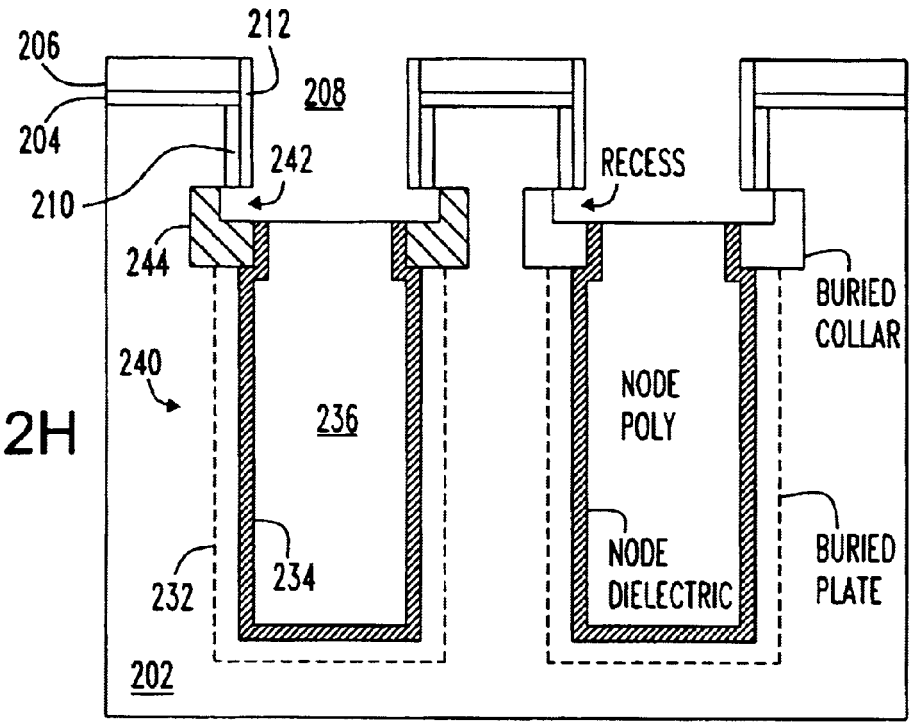
Figure 2I:
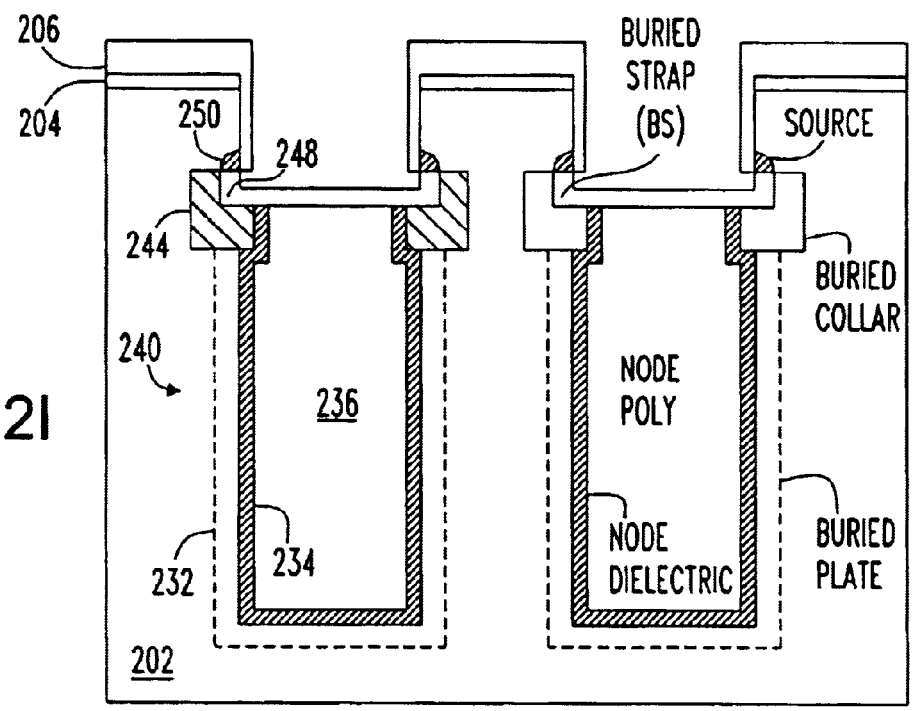
Figure 2J:
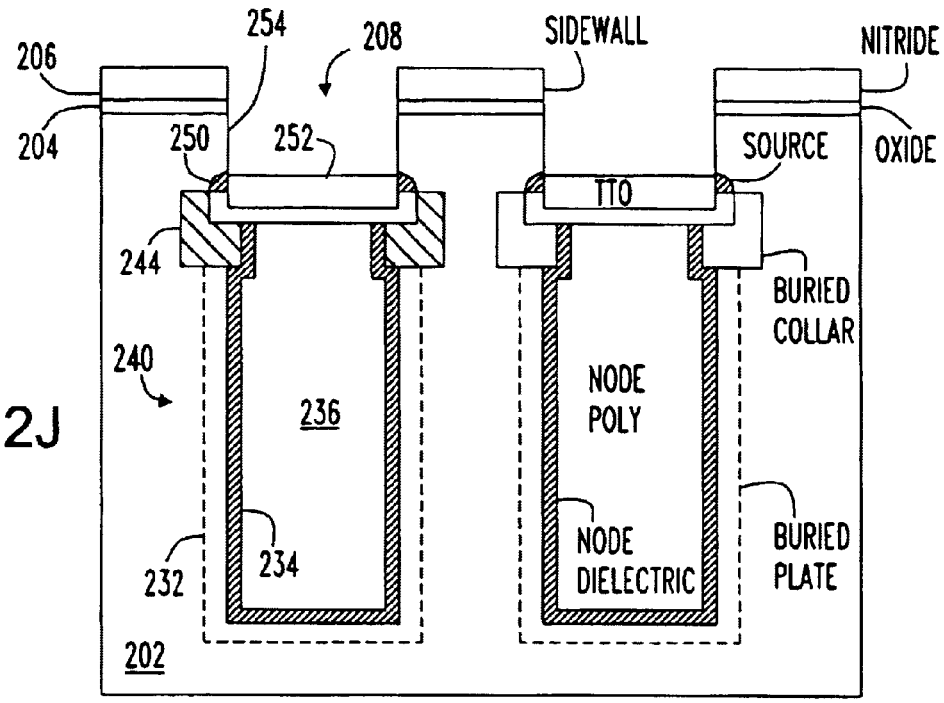
Figure 2K:
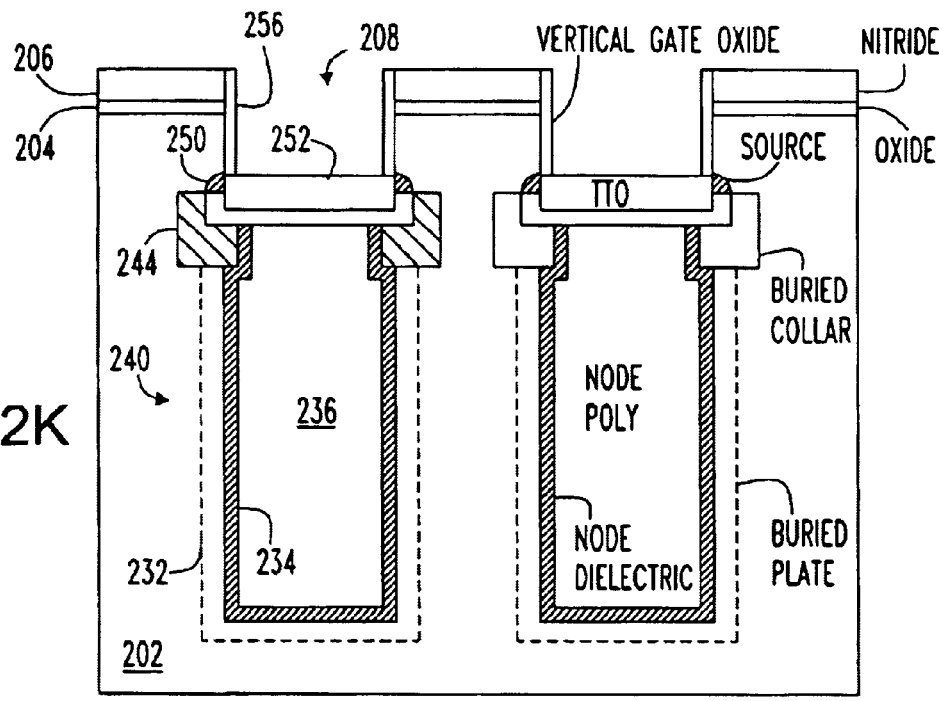
Figure 2L:
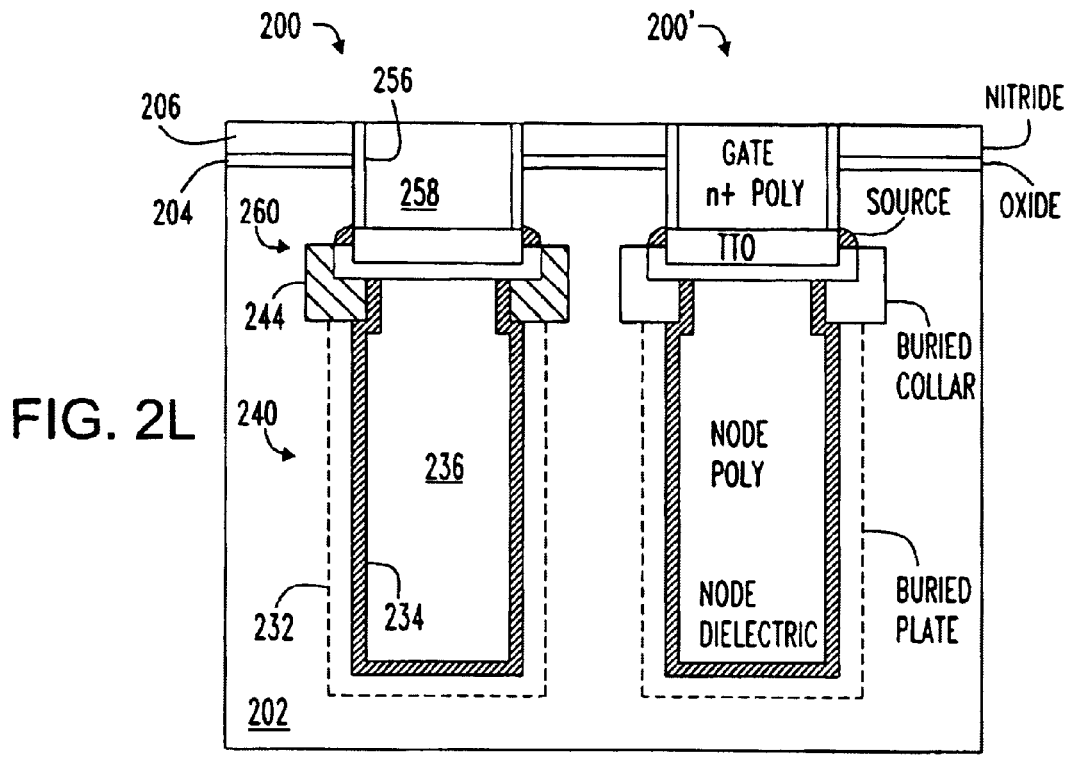
Figure 3:
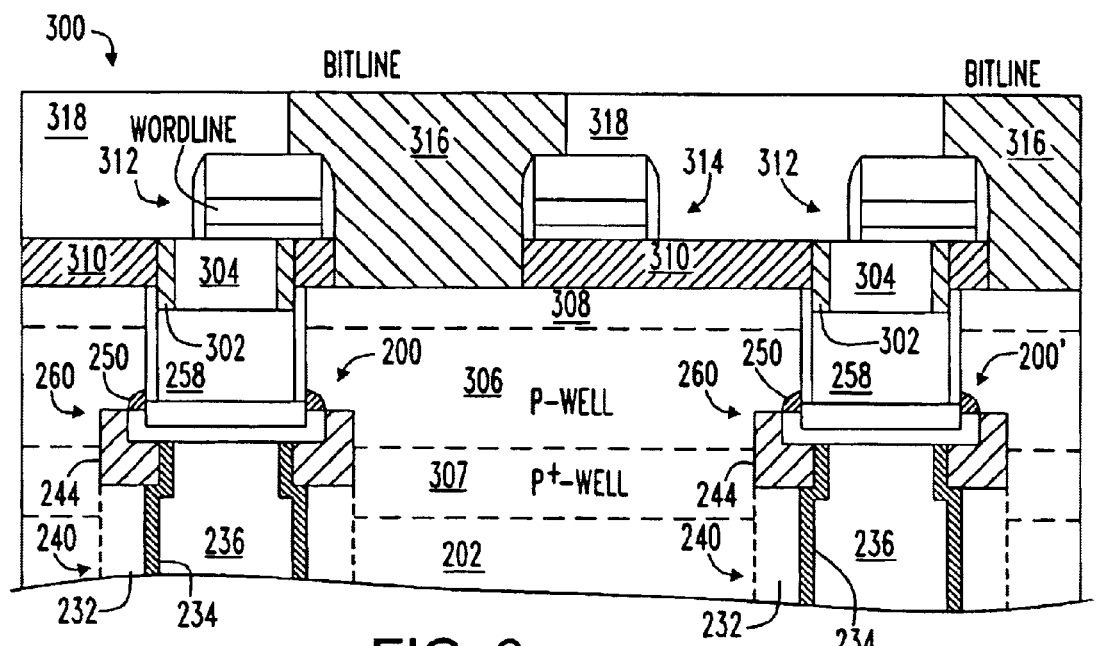
FIG. 3 is a cross-sectional view an adjacent pair of DRAM cells with word lines and bit lines, according to the invention.

FIG. 2 illustrates a semiconductor substrate 202 within which DRAM cells can be formed. The steps for forming the DRAM cells are described in FIGS. 2A–2L. In each figure, two DRAM cells are shown being fabricated. Typically, the elements in the DRAM cell on the left are numbered (###) and may be shaded (cross-hatched), and the elements in the DRAM cell on the right are labeled (text) and are not shaded. FIGS. 2A–2K illustrate what is referred to as "interim" products, since they do not show a complete DRAM cell having a complete cell capacitor and a complete cell transistor. On the other hand, two completed DRAM cells (200, 200') are shown in FIG. 2L. FIG. 3 shows two completed DRAM cells with overlying word lines and bit lines. The invention is not limited to two DRAM cells—it is applicable to one DRAM cell or to many DRAM cells.

In the description that follows, exemplary dimensions are presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

Referring to FIG. 2, a semiconductor substrate 202 is provided. The substrate suitably comprises silicon or germanium. The substrate 202 can be made by epitaxial silicon or silicon on insulator. It may also be any other semiconductor materials such as germanium, silicon germanium, gallium arsenide, indium arsenide, etc. For simplicity, a lightly doped (P-type; p c—Si) semiconductor silicon substrate (wafer) is taken as an example. An oxidation process is suitably used to form a pad oxide layer 204 on the surface of the substrate. The thickness of the pad oxide layer 204 is approximately 30–50 Angstroms. A pad nitride layer 206 is then formed over the pad oxide 206, suitably by a CVD process. The thickness of the pad nitride layer 206 is approximately 2000 Angstroms.

A mask (not shown) is formed atop the substrate 202, and a first etch step, suitably RIE is performed to create openings 208 extending into the surface of the substrate. By way of example, these openings have a width of 100 nm (1000 Angstroms) and a depth of approximately 3000–5000 Angstroms (0.30–0.50 μm). A thermal oxide 210 having a thickness of approximately 30 Angstroms is grown within the openings, and then a nitride spacer 212 having a thickness of approximately 100 Angstroms is deposited on the sidewalls of the opening. (Well known steps such as cleaning nitride and oxide from the bottom of the opening by RIE are omitted, for descriptive clarity.) The resulting interim structure is shown in FIG. 2A.

As will become evident, the openings 208 will become the top portion of a deep trench, in the bottom portion of which is disposed a buried collar and a cell capacitor. As will also become evident, the openings 208 can have a width of less than 100 nm, an advantage of the invention being that it enables construction of DRAM cells having sub-100 nm trenches. The "sub-100 nm" refers to the width of the trench.

Next, an etching step, suitably reactive ion etching (RIE) is performed to form a cavity 214 under the opening 208. This cavity 214 extends approximately 5000 Angstroms further into the substrate 202. (The total depth of the opening 208 plus the cavity 214 of the trench is thus approximately 8,000–10,000 Angstroms). The resulting interim structure is shown in FIG. 2B.

Next, a pull-back step is performed, which is suitably a wet etch step with ammonia or a plasma etching with chlorine. This process will enlarge the cavity 214 approximately 300–500 Angstroms in all (width, depth) directions. For illustrative the cavity 214 is shown as having been widened to the left, as well as to the right. For each cavity 214, a middle portion 216 of the cavity is aligned under the opening 208, and an outer portion 218 of the cavity 214 is laterally adjacent the middle portion 216. The resulting interim structure is shown in FIG. 2C. The openings 208 and middle portions 216 of the cavities 214 comprise the top portion of what will eventually become a deep trench.

Next, oxide 220 is disposed in the outer portion 218 of the cavity 214. This may be done by a Low Pressure CVD (LPCVD) deposition process followed by an RIE etch, or alternatively by thermal oxide growth (also followed by a clean-up etch). (Here, for example, showing filling completely with oxide then removing all but the oxide structure 220 shown is omitted, for illustrative clarity.) This oxide structure 220 will eventually become the collar 244 (compare 138). The resulting interim structure is shown in FIG. 2D.

Next, deep trenches 230 are formed, such as by RIE. These deep trenches 230 are aligned under the openings 208 and directly under the middle portions 216 of the cavities 214. The bottom portions of the trenches 230, per se, have depth (vertical on the page) of approximately 70,000 Angstroms (7000 nm, 7 $\mu$m), a width (across the page) of 100 nm, or less, and a length (into the page) of 200 nm or less, two sidewalls (not shown) and two end walls (not shown). The resulting interim structure is shown in FIG. 2E.

It should be understood that the deep trenches 230 are the bottom/lower portion of an overall trench, the top/upper portion of which was formed by the openings 208 and cavity 214, as discussed above.

Next, the cell capacitor 240 is formed, as follows. A buried plate 232 is formed in the substrate adjacent the trench 230 by outdiffusing an n-type dopant such as arsenic (As) into the substrate 202. Buried plate doping may be formed by conventional processes such as outdiffusing arsenic from a layer of arsenic-doped silicon glass (ASG) on trench sidewall, gas phase doping (GPD), plasma doping, plasma immersion ion implantation, or any combination of these methods that are well known in prior art. Trench capacitance enhancement may be optionally practiced before or after buried plate formation. The trench enhancement approaches may include forming a bottle-shape in the lower trench 230, roughening the lower trench 230 by forming hemispherical silicon grains (HSG) on the lower trench surface, or any other trench capacitance enhancement methods known in prior art. See, for example, U.S. Pat. Nos. 6,544,838; 6,495,411; 6,403,412; 6,190,988; 5,849,638; 6,448,131; 6,555,430; and application No. 22106857A1 for methods of enhancing trench surface and thus trench capacitance. The combination of these approaches, such as combination of bottling and HSG can certainly be performed. An advantage of the present invention is that the upper trench (above 230) is already covered by nitride collar 212 and oxide structure 220 (244) before forming the buried plate and widening the lower trench 230. Therefore, only the lower trench 230 is doped and widened. A bottle-shaped lower trench may be formed by etching the lower trench by a wet process containing ammonia or a dry plasma containing chlorine. The resulting interim structure is shown in FIG. 2F. For clarity, the lower trench 230 is widened to form a bottle shape to illustrate the trench capacitance enhancement.

After forming the buried plate and the optional trench capacitance enhancement, a node dielectric 234 is formed on the sidewalls of the trench 230. The node dielectric 234 can be any suitable dielectric, such as oxide, nitride, oxynitride, aluminum oxide, other dielectric material, or any of their combinations. A LPCVD nitride of approximately 20 Angstroms atop a thin layer of thermal nitride of approximately 20 Angstroms is used in this invention. An oxidation at 900 degrees-C. for 60 seconds may be optionally performed after forming the node nitride dielectric to reduce the node leakage current and improve node dielectric reliability. After forming the node dielectric 234, the sidewalls of the trench 230 plus the cavity 216 plus the opening 208 would be coated with nitride. The entire trench is then filled with a conducting material ("node poly") 236, preferably polysilicon to form the cell capacitor 240 in the lower trench 230. The polysilicon 236 is then recessed so that it covers only approximately half (the depth of) the cavity 216, leaving a top portion (25–75%) of the cavity 216 exposed. The node nitride 234 in the upper trench that is not covered by node poly is then removed. The nitride can be removed by any suitable technique, including a mixture of hydrofluoric acid and ethylene glycol (HF/EG), or hot phosphoric acid (H$_3$PO$_4$). The resulting interim structure is shown in FIG. 2G.

Next, the exposed portion of the oxide structure 220 is etched to form a recess 242 in the top inside corner of the oxide structure 220. The oxide 220 may be etched by buffered hydrofluoric acid (BHF). The oxide structure 220 with the recess 242 is referred to hereinafter as the collar (or "buried collar") 244. The collar 244 is disposed laterally adjacent and surrounds the periphery of the top portion of the node conducting element 236. The resulting interim structure is shown in FIG. 2H.

Here a difference can readily be noted between the present invention and the prior art. The prior art collar 138 shown in FIG. 1 is formed inside the opening of trench which, as discussed above, imposes a dimensional limitation upon subsequent processing steps. In contrast thereto, the collar 244 of the present invention is not inside the trench, but rather is disposed outside the trench (buried in the sidewalls of the trench), thereby imposing no analogous dimensional limitation upon subsequent processing steps. The collar 244 is disposed at least partially, preferably substantially, and more preferably wholly (entirely) outside of the trench, in the substrate, within the sidewall of the trench.

Next, the buried strap (BS) 248 (compare 128) is fabricated. The buried strap is a thin (e.g., 300 Angstroms) layer of undoped or arsenic-doped polysilicon in the cavity 242. It can be deposited thick and etched back (fill and recess). It covers the top surface of the node conducting element 236, and extends into the recess 242 in the top inside corner of the collar 244, as is illustrated. In the subsequent thermal processes, arsenic out-diffuses into the substrate 202 from the buried strap 248 if it is doped, or from the doped node poly 236 through the buried strap 248 if it is not doped, thereby forming the source (or drain) 250 of the cell transistor (260, see FIG. 2L below). A thin layer of thermal nitride of approximately 10 Angstroms may be formed before the buried strap poly 248 is deposited to prevent forming the defects such as dislocations at the interface of the buried poly 248 and the substrate 202. The resulting interim structure is shown in FIG. 2I.

Here a difference can readily be noted between the present invention and the prior art. In the DRAM cell (e.g., 100) of the prior art, the strap 128 is disposed entirely atop the collar 138, and has substantially the same width as the collar 138. The outside surface of the strap 128 is adjacent the substrate 102. In the DRAM cell of the present invention, the strap 248 is self-aligned to, and embedded in the top surface of the buried collar 244; that is, it extends no higher than the collar (it is fully vertically embedded/buried in the collar) and it is laterally surrounded by the collar. The strap is disposed in the trench at substantially the same depth as the collar, with the exception that the collar extends deeper into the trench and covers the bottom surface of the strap. The collar 244 of the present invention is laterally adjacent and surrounds the outside surface (periphery) of the buried strap 248. The collar also covers the bottom surface of the strap. The outside surface of the strap 248 is not adjacent the substrate 202.

Both straps 128 and 248 diffuse into the substrate to form the source (or drain) of the cell transistor, and in both cases the collar 138, 244 is disposed between the strap 128, 248 and the cell capacitor 110, 240, respectively. Generally speaking, upward diffusion of the strap towards the cell transistor is desired.

However, as seen in FIG. 1, the strap 128 readily diffuses outwardly (laterally) into the substrate. In contrast thereto, outward diffusion of the strap 248 of the present invention is constrained by the laterally-surrounding collar 244. This is useful for suppressing BS-to-BS interaction when two DRAM cells are disposed closely adjacent each other.

Furthermore, as seen in FIG. 1, the strap 128 also diffuses downwardly into the substrate, towards the cell capacitor. In contrast thereto, downward diffusion of the strap 248 of the present invention is constrained by the collar 244. This is useful for increasing trench capacitance due to the relaxed requirement on collar length.

It is within the scope of the invention that the buried strap 248 is not recessed. However, the upper surface of the buried strap 248 should not extend above the upper surface of the buried collar 244.

Next, trench top oxide (TTO) 252 is formed by a suitable process such as high density plasma (HDP) CVD. But first, the nitride spacer (212) is stripped using by any suitable technique, including a mixture of HF and ethylene glycol (HF/EG), or hot phosphoric acid ($H_3PO_4$). The sidewall oxide (210) is then optionally stripped using BHF, or it can be stripped along with the nitride spacer 212 by HF/EG, leaving a "clean" sidewall 254 in the opening 208. The oxide deposited by HDP process has a thickness of approximately 250 Angstroms on trench sidewall and 700 Angstroms on top of trench poly 236 due to the anisotropic nature of HDP process (The deposition rate of HPD process is higher in the vertical direction than in the lateral direction). All oxide on the trench sidewall is then removed by BHF. Approximately the same amount of HDP oxide is removed from the top of trench poly 236, resulting approximate 350 Angstroms TTO. A thin layer of thermal oxide of approximately 50 Angstroms may be optionally formed before TTO deposition to protect the trench sidewall from the attack of plasma during HDP process. If so, this thin layer of thermal oxide on trench sidewall is removed along with the HDP oxide by BHF. The resulting interim structure is shown in FIG. 2J.

Next, vertical gate oxide 256 is formed on the clean sidewall 254 in the opening 208, atop the TTO 252. The vertical gate oxide 256 has a thickness of approximately 60 Angstroms formed by thermal oxidation. The resulting interim structure is shown in FIG. 2K.

Next, polysilicon 258 is deposited in the opening 218, and a chemical mechanical polishing (CMP) step is used to level off (planarize) the top surface of the substrate. The polysilicon forms the gate of the cell transistor 260. The resulting completed DRAM cell, comprising a cell transistor 260 and a cell capacitor 240, is shown in FIG. 2L.

In subsequent steps, described hereinbelow, bit lines and word lines can be formed, resulting in a "final structure", using conventional processes, forming electrical connections to the DRAM cells. An example is shown in FIG. 3.

With reference to FIG. 3, the gate poly 258 is shown somewhat taller (deeper), and the two DRAM cells 200, 200' are shown a little farther apart from one another than in FIG. 2L, and details of the cell capacitors 240 are omitted, for illustrative clarity. The subsequent steps leading to a final structure 300 having word lines and bit lines proceed substantially as illustrated, and comprise:

recessing the gate poly 258 below the pad oxide 204 (not shown in FIG. 3);

depositing (e.g., by LPCVD) nitride 302;

optionally, first growing a thin thermal oxide (not shown), to enhance nitride adhesion;

nitride RIE to form a trench top spacer from the nitride 302;

fill the trench (resulting from previous RIE step) with poly 304 and performing CMP;

shallow trench isolation formation (not shown);

pad nitride 206 strip (because it is stripped, it is not shown in FIG. 3);

pad oxide 204 strip (because it is stripped, it is not shown in FIG. 3);

sacrificial oxide (not shown because it is stripped in a subsequent step) growth, suitably approximately 60 Angstroms, which protects the surface of the silicon substrate 202 from being damaged by ion implantation in the next step;

boron ion implantation to form a p-well 306. Since the lateral extension of buried strap (i.e., source or drain) 250 into the p-well is constrained by the buried collar 244, a p+ region 307 which is highly doped by boron can be also formed. The p+ region is as high as the upper inner edge of the buried collar 244 and as low as the lower edge of the buried collar 244. This highly doped region lowers the p-well contact resistance and therefore improves the retention time (RT) of the device. The buried collar 244 isolates the buried strap 250 from the p+ region 307. Herein is another advantage of the invention. If the same p+ region (307) were formed in the prior art structure shown in FIG. 1 where the buried strap 122 is not constrained, various thermal processes would cause the n-type dopant to outdiffuse laterally and vertically from the buried strap 122 and the p-type dopant to outdiffuse from the p+ region. When the p+ region and the buried strap merge, the leakage current is increased and therefore the device performance is degraded.

Next, arsenic or phosphorous ion implantation to form an n+ doped layer 308 in the top region of the substrate which will become the source (or drain) in the upper trench. This n+ layer 308 should be deeper than the trench top spacer 302.

Then the sacrificial oxide is stripped, and an array top oxide (ATO) 310 is formed. The formation of ATO comprises an oxide deposition step and an optional planarization step. The deposition process can be a HDP CVD, or other suitable process. The planarization can be achieved by chemically mechanical polishing (CMP) or other suitable processes.

Next, active word line 312 and passing word line 314 structures (stacks) are formed; the wordline may or may not be offset to the trench. FIG. 3 shows the offset case. Each word line stack may include a conducting layer or layers such as poly, tungsten nitride (WN) and/or tungsten (W), or combinations thereof, a nitride cap on top of the conducting layer(s), and a nitride spacer astride the conducting layer(s);

Next, bitline contacts 316 are formed by depositing borophospho-silicate glass (BPSG) 318, patterning to open a contact area, filling the open area with conducting material such as poly or metal.

The invention has been illustrated and described in a manner that should be considered as exemplary rather than restrictive in character—it being understood that all changes and modifications that come within the scope of the invention as set forth in the claims. For example, an n+ buried plate 232 is used in this invention by outdiffusion of arsenic into the substrate. Other n-type dopants such as phosphorous and antimony may also be used to form the n+ buried plate. Boron or indium can be used if a p-type dopant is desired in the buried plate. Similarly, the vertical device described in the invention is an nMOSFET in which the buried strap 250 and the top doping layer 268 are n-type and a p-well 306 is formed in the substrate. If a pMOSFET is desired, the buried strap and the top doping layer will be doped by p-type dopant such as boron or indium and an n-well will be formed in the substrate.

What is claimed is:

1. A DRAM cell comprising:
   a semiconductor substrate;
   a trench extending into the substrate;
   a cell capacitor disposed in a bottom portion of the trench;
   a cell transistor disposed in a top portion of the trench above the cell capacitor;
   a node conducting element connecting the cell capacitor to the cell transistor; and
   a collar disposed about the node conducting element between the cell transistor and the cell capacitor;
   wherein:
   the collar is disposed in the substrate, at least partially outside of the trench, between the cell capacitor and the cell transistor;
   further comprising:
   a strap disposed in the trench and having an outside peripheral surface; and
   the collar is laterally adjacent and surrounds the outside peripheral surface of the buried strap;
   wherein:
   the strap is embedded into a top surface of the collar; and
   the strap extends no higher than the collar.

2. A DRAM cell, according to claim 1, wherein:
   the collar is disposed substantially outside of the trench.

3. A DRAM cell, according to claim 1, wherein:
   the collar is disposed wholly outside of the trench.

4. A DRAM cell, according to claim 1, further comprising:
   the strap being disposed between the node conducting element and the cell transistor.

5. A DRAM cell, according to claim 1, further comprising:
   the strap being self-aligned with the collar.

6. A DRAM cell, according to claim 1, further comprising:
   the strap being disposed in the trench at substantially a same depth as the collar.

7. A DRAM cell, according to claim 1, further comprising:
   the strap being disposed in the trench and laterally surrounded by the collar.

8. A DRAM cell, according to claim 1, further comprising:
   a recess disposed in a top inside corner of the collar; an
   the strap extends into the recess in the top inside corner of the collar.

9. A DRAM cell comprising:
   a semiconductor substrate;
   a trench extending into the substrate;
   a cell capacitor disposed in a bottom portion of the trench;
   a cell transistor disposed in atop portion of the trench above the cell capacitor;
   a node conducting element connecting the cell capacitor to the cell transistor; and
   a collar disposed about the node conducting element between the cell transistor and the cell capacitor;
   wherein:
   the collar is disposed in the substrate, at least partially outside of the trench, between the cell capacitor and the cell transistor;
   further comprising:
   a strap disposed in the trench and having an outside peripheral surface; and
   the collar laterally adjacent and surrounds the outside peripheral surface of the buried strap;
   wherein;
   the strap is fully vertically embedded in the collar and it is laterally surrounded by the collar.

10. A DRAM cell, according to claim 9, wherein:
    the strap is disposed in the trench at substantially a same depth as the collar; and
    the collar extends deeper into the trench than the strap and covers a bottom surface of the strap.

11. A DRAM cell, according to claim 9, wherein:
    the collar covers a bottom surface of the strap.

* * * * *